United States Patent [19]
Katoh

[11] Patent Number: 4,818,959
[45] Date of Patent: Apr. 4, 1989

[54] PHASE EQUALIZER

[75] Inventor: Ikuo Katoh, Chiba, Japan

[73] Assignee: TDK Corporation, Tokyo, Japan

[21] Appl. No.: 28,086

[22] Filed: Mar. 19, 1987

[30] Foreign Application Priority Data

Mar. 28, 1986 [JP] Japan .................... 61-70227
Mar. 28, 1986 [JP] Japan .................... 61-70228
May 7, 1986 [JP] Japan .................... 61-105613

[51] Int. Cl.$^4$ .................... H03H 7/00; H03H 9/46; H03H 9/66
[52] U.S. Cl. .................... 333/28 R; 333/141; 333/191; 333/192
[58] Field of Search .................... 333/28 R, 191, 192, 333/189; 455/307, 339; 329/117

[56] References Cited

U.S. PATENT DOCUMENTS

| | | | |
|---|---|---|---|
| 3,569,873 | 3/1971 | Beaver | 333/28 R X |
| 3,737,814 | 6/1973 | Pond | 333/28 R X |
| 4,096,454 | 6/1978 | Behrend | 333/28 R X |
| 4,287,493 | 9/1981 | Masaie | 333/192 X |

FOREIGN PATENT DOCUMENTS

| | | | |
|---|---|---|---|
| 1219989 | 6/1966 | Fed. Rep. of Germany | 333/28 R |
| 136256 | 10/1979 | Japan . | |
| 136257 | 10/1979 | Japan . | |

OTHER PUBLICATIONS

Williams, *Electronic Filter Design Handbook*, McGraw-Hill, N.Y., 1981, Title page & pp. 7-20- →7-22.

Primary Examiner—Paul Gensler
Attorney, Agent, or Firm—Martin M. Novack

[57] ABSTRACT

A phase equalizer with a pair of ceramic resonators with different resonant frequencies than each other provides convex group delay time characteristics, which compensates for the concave group delay time characteristics of a ceramic filter. Thus, the flat group delay time characteristics in the combination of a ceramic filter and a phase equalizer is obtained, and excellent speech quality in analog signal transmission and/or excellent error rate in data transmission is obtained, while keeping excellent selectivity in a wireless communication system.

16 Claims, 19 Drawing Sheets

FIG. I
(PRIOR ART)
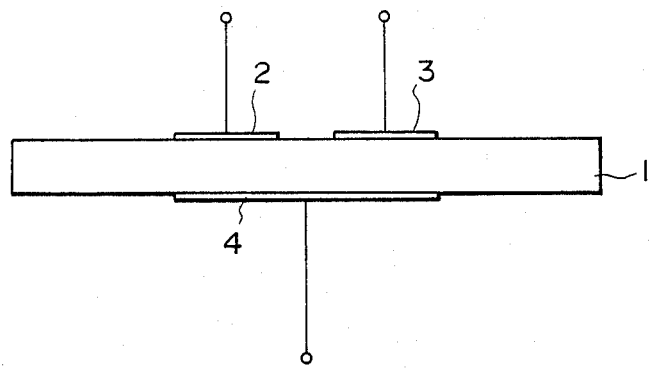
FIG. 2
(PRIOR ART)
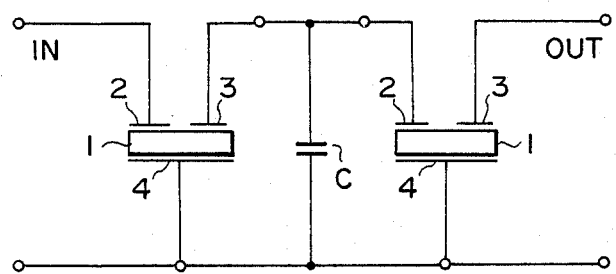

(a)

(b)

PHASE EQUALIZER

BACKGROUND OF THE INVENTION

The present invention relates to a phase shifter or a phase equalizer, which is used to provide flat group delay time when it is used in a filter circuit which has sharp amplitude characteristics. The present phase equalizer is, for instance, used in an intermediate frequency amplifier stage in an FM radio receiver or an AM radio receiver.

In an intermediate frequency stage of a radio receiver set, a ceramic filter has been used for providing sharp amplitude (or attenuation response) characteristics to get rid of interference from an adjacent frequency radio station.

FIG. 1 shows a prior ceramic filter for tuning with sharp amplitude characteristics. In the figure, the numeral 1 is a ceramic substrate, 2 and 3 are a pair of separated electrodes attached on one surface of the substrate, 4 is a common electrode attached on the other surface of the substrate.

FIG. 2 shows a circuit diagram of a filter circuit which has two ceramic filters of FIG. 1 with the capacitor C for coupling the filters.

By the way, an intermediate frequency (IF) filter is required to have sharp amplitude characteristics so that no interference from an adjacent frequency station occurs. However, it should be noted that a filter with sharp amplitude response has in general non-flat delay characteristics. When the delay characteristics are not flat, the demodulated signal has a significant amount of distortion. So, when the signal is speech or music, the quality is substantially deteriorated, and when the signal is data, the error rate increases.

If we try to obtain flat delay characteristics in a prior art, the amplitude response of a filter is deteriorated, and we suffer from interference.

FIGS. 3 through 5 show delay characteristics and attenuation characteristics of a prior ceramic filter. In those figures, the curves $A_1$, $A_2$ and $A_3$ show group delay characteristics, $B_1$, $B_2$ and $B_3$ show attenuation response, the vertical axis at right side shows delay time ($\mu$S), the vertical axis at left side shows attenuation (dB), and the horizontal axis shows frequency.

FIG. 3 is the case that the value Q of the ceramic filter is 300, FIG. 4 is the case that Q is 200, and FIG. 5 is the case that Q is 100.

It should be noted in FIG. 3 which has high value of Q (Q=300) that the attenuation response curve $B_1$ is sharp, and the selectivity of a receiver set is excellent. However, the group delay characteristics $A_1$ has two peaks with deep concaved recesses between the peaks. This group delay characteristics would provide much distortion to the demodulated signal.

On the other hand, FIG. 5 has relatively flat delay characteristics $A_3$. However, it has broad attenuation response, which is not satisfactory in selectivity. Further, FIG. 5 has large insertion loss for a filter (the insertion loss is about 9 dB). Therefore, if we try to couple a plurality of filters of FIG. 5 in a series to obtain satisfactory attenuation response, the total insertion loss would increase in proportion to the number of filters, and therefore, that attempt is not practical.

The characteristics of FIG. 4 are intermediate between those of FIG. 3 and FIG. 5, however, in case of FIG. 4, both the attenuation response and the delay characteristics are unsatisfactory.

There have been attempts to equalize or compensate undesirable phase characteristics by an IF filter. Some of them are an equalizer using an LC circuit, and an equalizer using an interdigital filter. However, prior equalizers have the disadvantage that the size is too large to mount it in a small housing of a miniaturized radio set.

Other prior arts are Japanese patent laid open publications Nos. 136256/79 and 136257/79, which show a phase equalizer with a single ceramic energy confine type resonator. However, they have the disadvantages that the design for obtaining the desired characteristics is critical, and that it is difficult to obtain the desired bandwidth and the desired phase characteristics.

SUMMARY OF THE INVENTION

It is an object, therefore, of the present invention to overcome the disadvantages and limitations of a prior phase equalizer by providing a new and improved phase equalizer.

It is also an object of the present invention to provide a phase equalizer which is small in size and has small insertion loss.

The above and other objects are attained by a phase equalizer inserted in a four-terminal network with predetermined bandwidth having a first ceramic resonator having first anti-resonant frequency at one end of bandwidth, and a second ceramic resonator having second resonant frequency at the other end of said bandwidth.

BRIEF DESCRIPTION OF THE DRAWINGS

The foregoing and other objects, features, and attendant advantages of the present invention will be appreciated as the same become better understood by means of the following description and accompanying drawings wherein;

FIG. 1 shows structure of a prior ceramic filter,

FIG. 2 is a circuit diagram of a ceramic filter using the element of FIG. 1,

DESCRIPTION OF THE PREFERRED EMBODIMENTS

Figure 6:
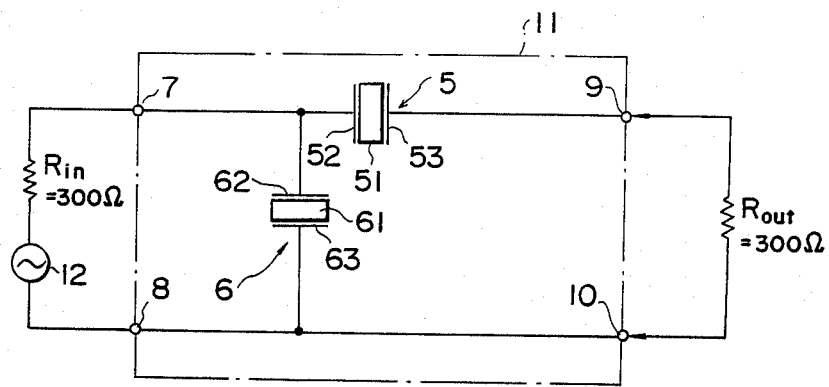
FIG. 6 shows circuit diagram of a phase equalizer according to the present invention.

FIG. 6 shows a circuit diagram of a phase equalizer according to the present invention. In the figure, the numeral 5 is a first ceramic resonator which is inserted in a series arm in the four-terminal network, and 6 is a second ceramic resonator coupled in a parallel arm of the four-terminal network. The embodiment shows that a single pair of ceramic resonators 5 and 6 are provided, and it should be noted that a plurality of pairs of ceramic resonators may be used in the present invention.

The anti-resonant frequency of the first resonator 5 differs from the resonant frequency of the second resonator 6. That is to say, when the anti-resonant frequency of the first resonator 5 is a $F_{a1}$ and the resonant frequency of the second resonator is $F_{r2}$, $$F_{a1} \neq F_{r2}$$

is satisfied. Preferably, the anti-resonant frequency and the resonant frequency $F_{a1}$ and $F_{r2}$ are selected so that they coincide with the cut-off frequencies of the filter which is the subject of compensation for phase distortion.

The first resonator 5 has a piezoelectric ceramic substrate 51 with the electrodes 52 and 53 on both the surfaces of the same. The first electrode 52 is connected to the input terminal 7 and the second electrode 53 is connected to the output terminal 9. The second resonator 6 has a piezoelectric substrate 61 with a pair of electrodes 62 and 63 on both the surfaces of the substrate. Those electrodes 62 and 63 are connected to the input terminals 7 and 8, respectively.

The combination of the first ceramic resonator 5 and the second ceramic resonator 6 consists of the phase equalizer 11 according to the present invention. The numeral 12 is a signal source, $R_{in}$ is an input resistor, and $R_{out}$ is an output resistor. Those resistors $R_{in}$ and $R_{out}$ have the resistance 300 ohms in the embodiment.

Figure 7:
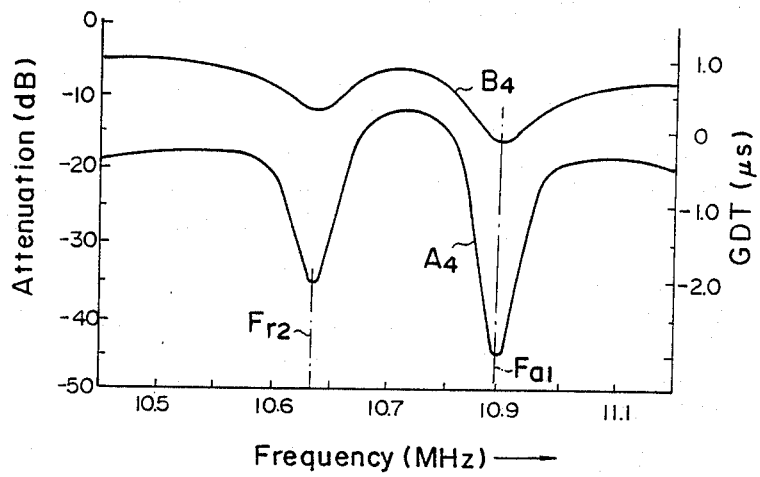
FIG. 7 shows curves of characteristics of the device of FIG. 6, FIG. 8A and FIG. 8B show a ceramic resonator, and the characteristics curves of the same.

FIG. 7 shows the characteristic curves of the phase equalizer 11 of FIG. 6. In FIG. 7, the horizontal axis shows the frequency in MHz, the vertical left axis shows the attenuation in dB, and the vertical right axis shows the group delay time in $\mu S$.

The curve $A_4$ shows the group delay characteristic of the present phase equalizer. As apparent in the figure, the delay time of the curve $A_4$ is large at the anti-resonant frequency $F_{a1}$ and the resonant frequency $F_{r2}$ of the resonators, and the delay time between the anti-resonant frequency and the resonant frequency is smaller than that at those frequencies. Therefore, the delay time between the anti-resonant frequency and the resonant frequency is convex. It should be noted that convex phase characteristics are opposite to the concave characteristics of a ceramic filter in FIGS. 3 through 5. Therefore, the combination of the characteristics of $A_4$ in FIG. 7 with a prior ceramic filter provides the desirable flat group delay characteristics, in which speech quality and/or error rate of digital signal is not deteriorated.

Figure 8:
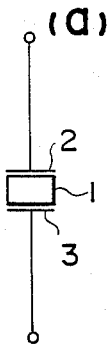
Figure 8:
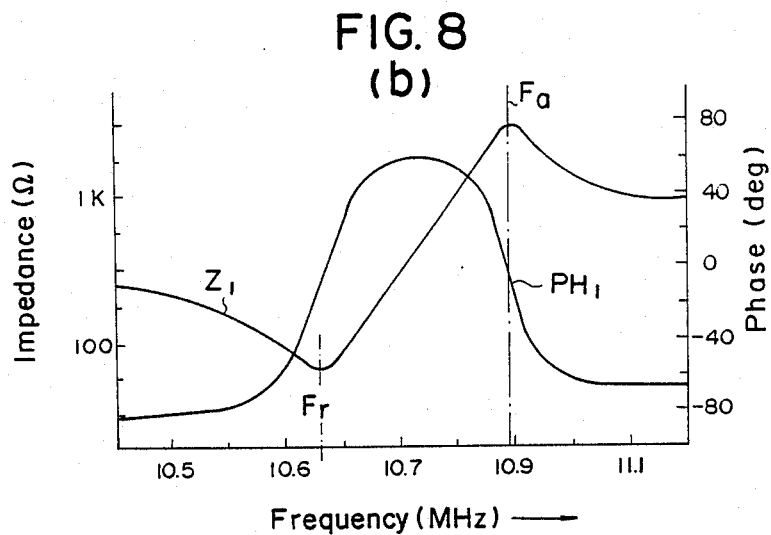
Figure 9:
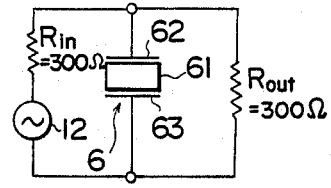
FIG. 9A and FIG. 9B show a ceramic resonator connected to a line, and the characteristics curves of the same.
Figure 9:
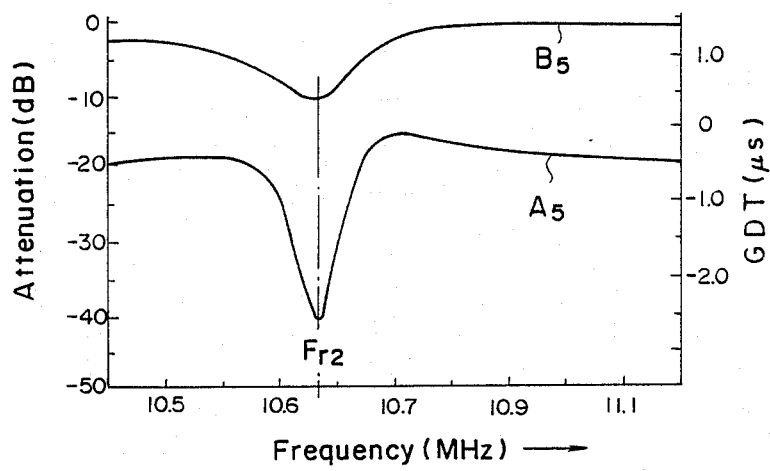
Figure 10:
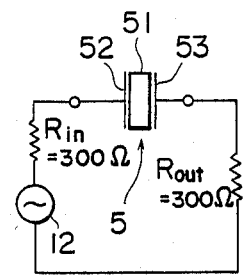
FIG. 10A and FIG. 10B show a ceramic resonator inserted in the line in a series, and the characteristics curves of the same.
Figure 10:
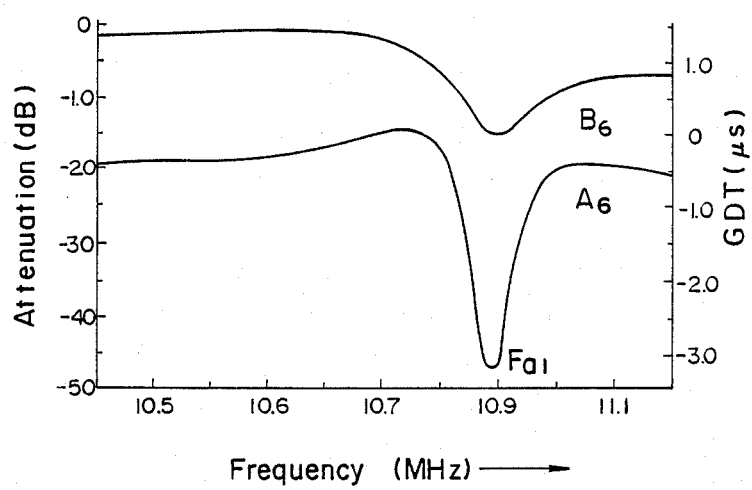

The theoretical analysis of the present equalizer is described in accordance with FIGS. 8 through 10. A ceramic resonator having a piezoelectric substrate 1 with a pair of electrodes 2 and 3 as shown in FIG. 8A has the impedance characteristics $Z_1$ and the phase characteristics $PH_1$ as shown in FIG. 8B, in which $F_r$ is the resonant frequency, $F_a$ is the anti-resonant frequency, the horizontal axis is the frequency, the vertical left axis is the impedance, and the vertical right axis is the phase in degree.

When the ceramic resonator is coupled in a parallel arm of a four-terminal network as shown in FIG. 9A, in which the input impedance and the output impedance are 300 ohms, respectively, and the circuit is energized by the signal source 12, the group delay characteristic $A_5$ has a deep valley at the resonant frequency $F_{r2}$ as shown in FIG. 9B. The curve $B_5$ in FIG. 9B is the attenuation response of FIG. 9A.

On the other hand, when the ceramic resonator is coupled in a series arm of a four-terminal network as shown in FIG. 10A, the group delay time characteristics $A_6$ which has deep valley at the anti-resonant frequency $F_{a1}$ is obtained as shown in FIG. 10B. The curve $B_6$ in FIG. 10B shows the attenuation response of the circuit of FIG. 10A. In FIGS. 9B and 10B, the horizontal axis is the frequency, the vertical left axis is the attenuation, and the vertical right axis is the delay time.

It should be appreciated that the superposition of FIG. 9A and FIG. 10A is essentially the same as FIG. 6. Therefore, it should be appreciated that the characteristics of FIG. 7 are obtained by superposing the characteristics of FIG. 9B and FIG. 10B according to the mathematical principle of superposition.

Figure 11:
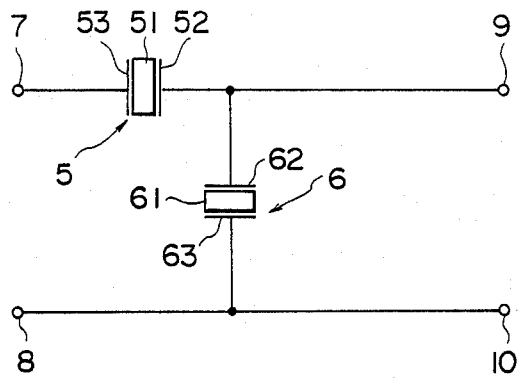
FIG. 11 shows the modification of the phase equalizer according to the present invention.

FIG. 11 is the modification of the phase equalizer of FIG. 6. The feature of FIG. 11 is that series arm and parallel arm of the circuit are opposite to those of FIG. 6. In other words, the second resonator 6 is coupled across the output terminals 9 and 10, and the first resonator 5 is inserted between the input terminal 7 and the output terminal 9. The effect of FIG. 11 is similar to that of FIG. 6, and it provides the desirable convex group delay time characteristics.

Figure 12:
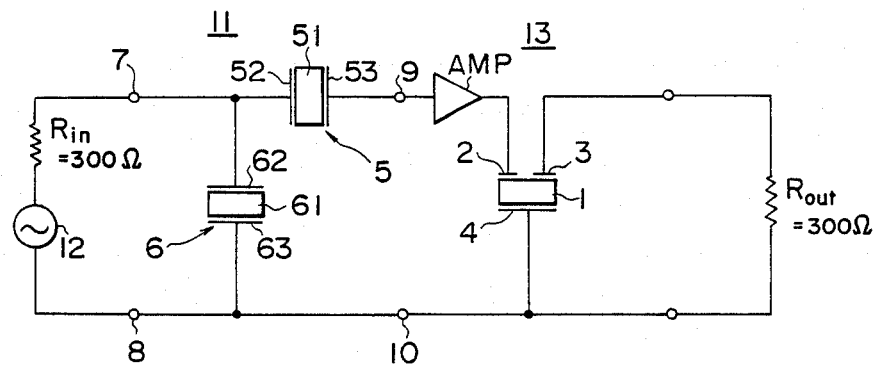
FIG. 12 shows the combination of a ceramic filter and a phase equalizer.

FIG. 12 shows the practical circuit in which the present phase equalizer 11 is coupled with a prior ceramic filter 13 through an amplifier AMP which has an input impedance of 300 ohms and an output impedance of 300 ohms, and doubles as a buffer.

Figure 3:
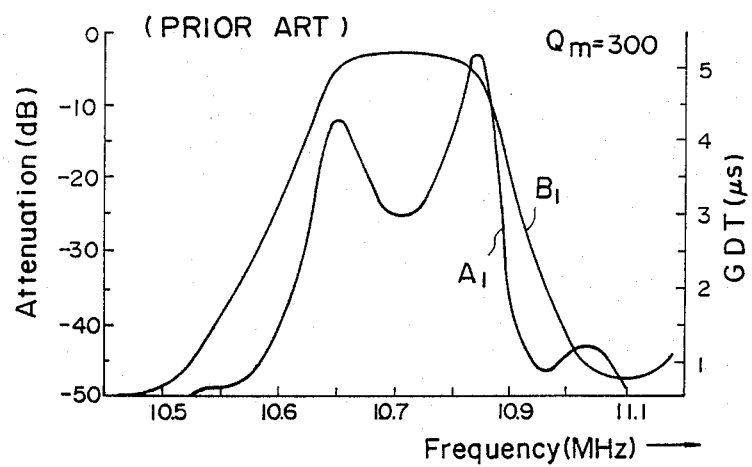
FIGS. 3, 4 and 5 show curves of attenuation response and group delay response of a prior ceramic filter.
Figure 4:
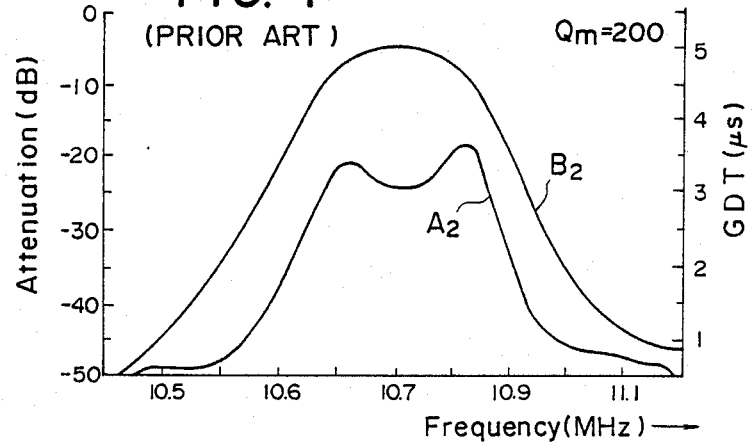
Figure 5:
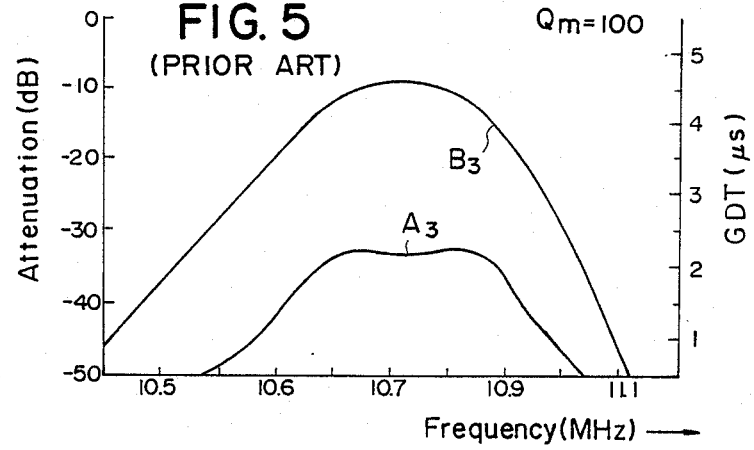
Figure 13:
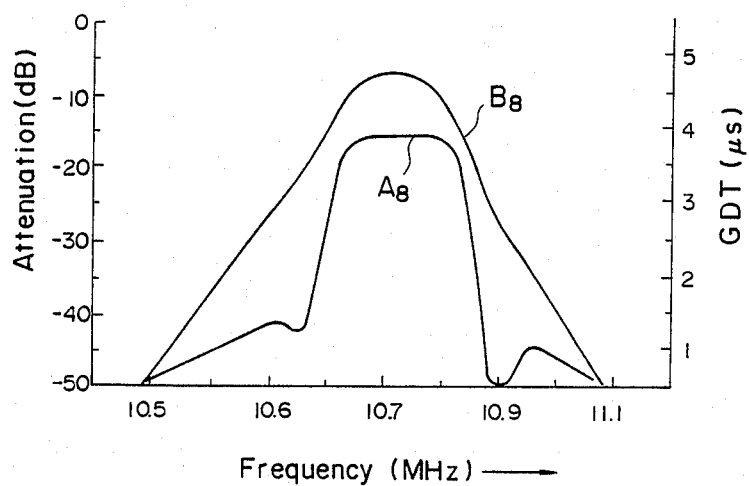
FIG. 13 shows characteristics curves of the total circuit of FIG. 12.

The group delay time characteristic of a ceramic filter 13 is concave as shown in the curves $A_1$, $A_2$ or $A_3$ in FIGS. 3 through 5. And, the group delay time characteristic of the phase equalizer 11 is convex as shown in the curve $A_4$ in FIG. 7. Therefore, the combination of the concave curve and the convex curve provide the flat delay time characteristic as shown in the curve $A_8$ in FIG. 13. As for the attenuation response, the combination of the filter and the phase equalizer provides the curve $B_8$ of FIG. 13. As the phase equalizer has some attenuation response, the combined attenuation response $B_8$ is improved as compared with an attenuation response of only a filter.

Figure 14:
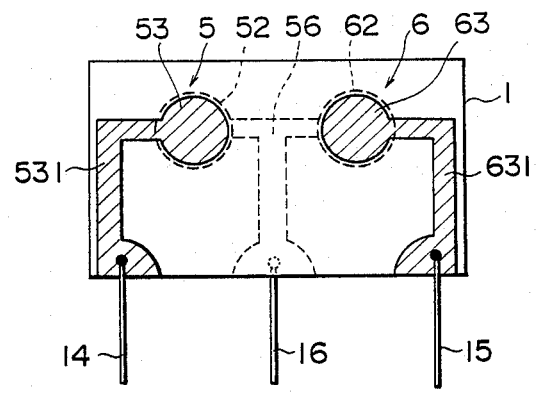
FIG. 14 is a plane view of the phase equalizer of FIG. 6 and FIG. 11.
Figure 15:
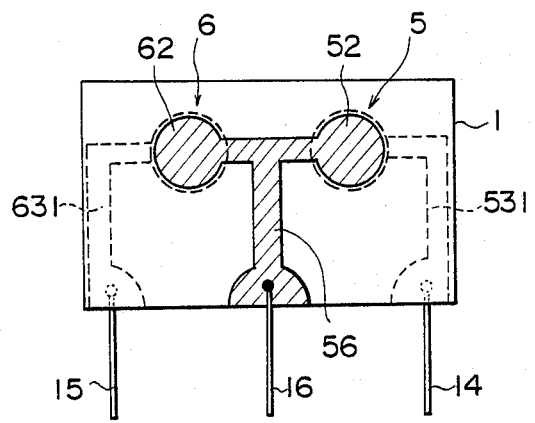
FIG. 15 is a bottom view of FIG. 14.

The structure of the present phase equalizer is shown in FIGS. 14 and 15, in which FIG. 14 is a plane view and FIG. 15 is a bottom view. In those figures, the numeral 1 is a flat thin piezoelectric ceramic substrate which has a pair of electrodes 53 and 63 on one surface. The electrode 53 is a part of the resonator 5, and the electrode 63 is a part of the resonator 6. On the rear surface of the substrate, a pair of electrodes 52 and 62 are deposited so that those electrodes face with said electrodes 53 and 63, respectively. The electrodes 52 is coupled with the electrode 62 through the lead electrode 56. The lead terminals 14 and 15 are connected to the lead electrodes 531 and 631, respectively, which are coupled with the electrodes 53 and 63, respectively. Similarly, the lead terminal 16 is connected to the lead electrode 56.

The lead terminal 16 is connected to the input terminal 7, the lead terminal 14 is connected to the output terminal 9, and the lead terminal 15 is connected to the input terminal 8 and the output terminal 10, then, the phase equalizer of FIG. 6 is obtained.

Similarly, when the phase equalizer of FIG. 11 is desired, the lead terminal 14 is connected to the input terminal 7, the lead terminal 16 is connected to the output terminal 9, and the lead terminal 15 is connected to the input terminal 8 and the output terminal 10.

Figure 16:
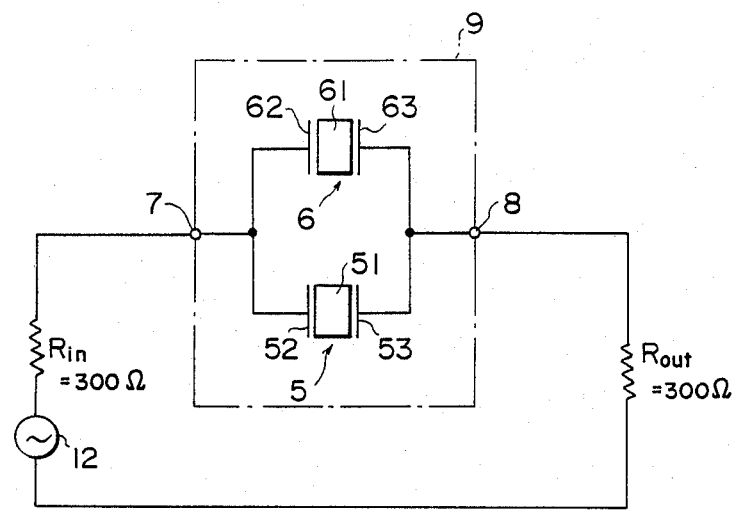
FIG. 16 shows another embodiment of a phase equalizer according to the present invention.
Figure 17:
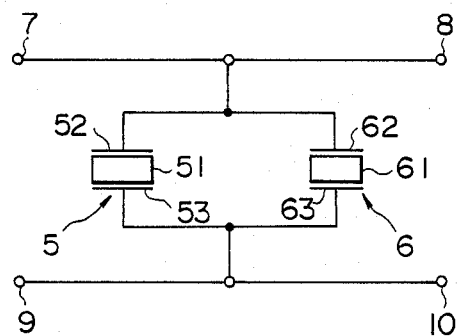
FIG. 17 is a modification of FIG. 16.

FIG. 16 and FIG. 17 show the modification of the present phase equalizer. In that modification, a pair of ceramic resonators 5 and 6, each having different resonant frequencies from each other or the different anti-resonant frequency from each other, are connected in parallel. And, the parallel circuit of two ceramic resonators are inserted in a series arm (FIG. 16), or in a parallel arm (FIG. 17) in a four-terminal network. Those modifications provide the similar equalization characteristics with the convex curve as shown in FIG. 7.

Figure 18:
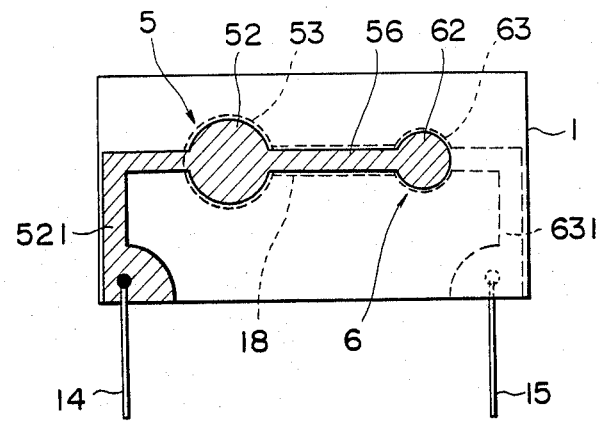
FIG. 18 is a plane view of a phase equalizer of FIG. 16 and FIG. 17.
Figure 19:
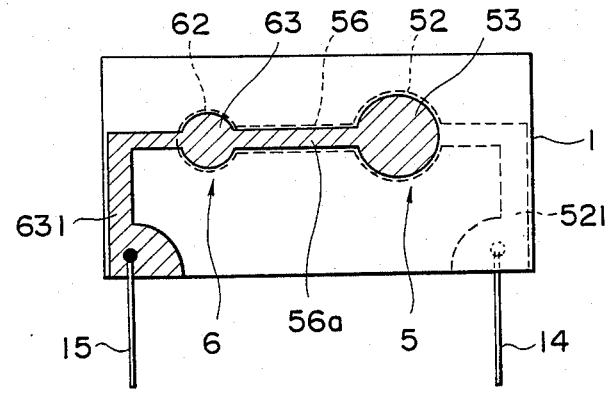
FIG. 19 is a bottom view of FIG. 18.

FIGS. 18 and 19 show the structure of the phase equalizer of FIG. 16 or FIG. 17, in which FIG. 18 is a plane view and FIG. 19 is a bottom view.

In those figure, the numeral 1 is a piezoelectric ceramic substrate. On one surface of the substrate, a pair of electrodes 52 which are a part of the resonator 5, and the electrodes 62 which is a part of the resonator 6 are deposited with some spacing. The electrodes 52 and 62 are connected by a lead electrode 56. The terminal 14 is connected to the electrode 52 through the lead electrode 521. On the rear surface of the substrate 1, a pair of electrodes 53 and 63 are deposited so that those electrodes face with electrodes 52 and 62. The rear electrodes 53 and 63 are connected together by a lead electrode 56a. The terminal 15 is connected to the electrode 63 through the lead electrode 631.

In order to provide that the resonant frequency of the first ceramic resonator differs from that of the second ceramic resonator, or the anti-resonant frequency of the first ceramic resonator differs from that of the second ceramic resonator, the area or the size of the electrodes 52 and 53 of the resonator 5 are different from the electrodes 62 and 63 of the resonator 6 in the embodiment.

Figure 20:
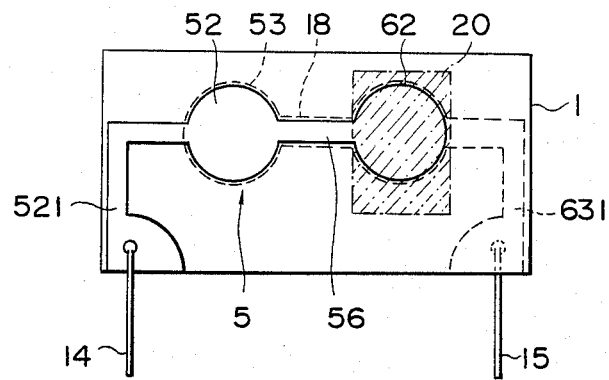
FIG. 20 is a modification of FIG. 18.

FIG. 20 shows the modification of the structure of the present equalizer, in which the solder resist 20 having some mass is attached to the electrode 62. In this case, the area or the size of the electrode 62 is the same as that of the electrode 52. The amount of the resist 20 is selected so that the desired difference of the resonant (or the anti-resonant) frequency is obtained.

Of course, it should be appreciated that the embodiment of FIG. 18 may be combined with the embodiment of FIG. 20, and the area of the electrode 62 differs from that of the electrode 52, and simultaneously, some mass is attached to the electrode 62.

Figure 21:
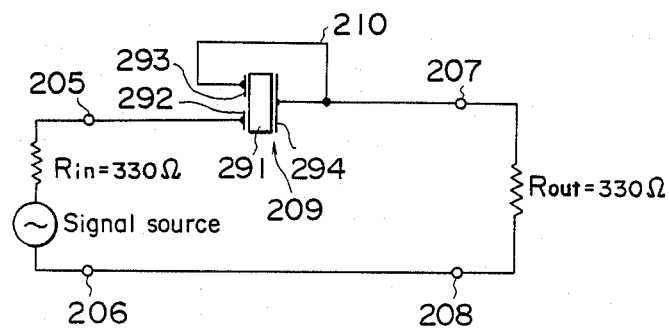
FIG. 21 is a still another embodiment of a phase equalizer according to the present invention.

FIG. 21 shows another embodiment of the phase equalizer which is implemented by a ceramic resonator according to the present invention. In the figure, the numeral 205 and 206 are input terminals, 207 and 208 are output terminals. Those terminals create a four-terminal network. The numeral 209 is a ceramic resonator which functions as a phase equalizer. The ceramic resonator 209 has a piezoelectric thin substrate 291 which has a pair of separated electrodes, 292 and 293, on one surface of the substrate. On the other surface of the substrate, a common electrode 294 which faces with both the separated electrodes 292 and 293 is deposited. One of the separated electrodes, 293, is connected to the common electrode 294 through the external lead line 210. The other separated electrode, 292, is connected to the input terminal 205, and the common electrode 294 is connected to the output terminal 207 so that the resonator 209 is inserted in the series arm of the four-terminal network. The resonator 209 is in a practical circuit energized by a signal source through an input impedance $R_{in}$ and a load $R_{out}$ is coupled with the output terminals 207 and 208.

Figure 22:
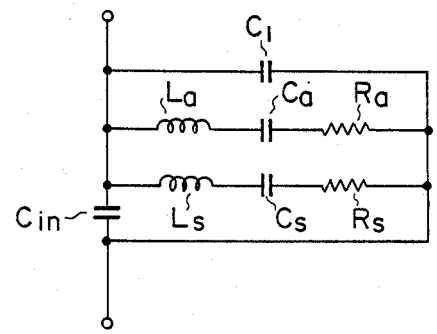
FIG. 22 is an equivalent circuit of the phase equalizer of FIG. 21.
Figure 23:
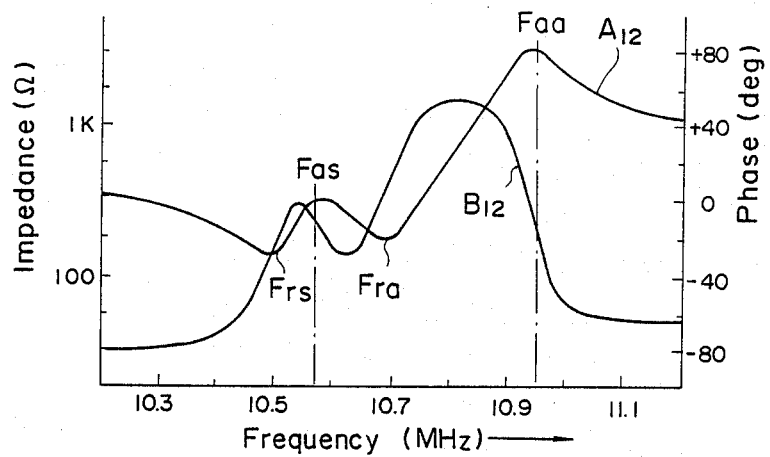
FIG. 23 shows frequency curves of phase and impedance.

FIG. 22 is an equivalent circuit of the phase equalizer of FIG. 21, and FIG. 23 shows the curves between phase-frequency, and impedance-frequency characteristics. In FIG. 23, the horizontal axis shows frequency in MHz, the vertical left axis shows the impedance in ohms, and the vertical right axis shows the phase in degree. The curve $A_{12}$ shows the impedance characteristics, and the curve $B_{12}$ shows the phase characteristics.

The FIG. 23 shows that the resonator has two resonant frequencies $F_{rs}$ and $F_{ra}$, and two anti-resonant frequencies $F_{as}$ and $F_{aa}$. The resonant frequencies $F_{rs}$ and $F_{ra}$ are expressed as follows by using the equivalent circuit of FIG. 22.

$$F_{rs} = 1/(2\pi \sqrt{L_s C_s})$$

-continued $$F_{ra} = 1/(2\pi \sqrt{L_a C_a})$$

Figure 24:
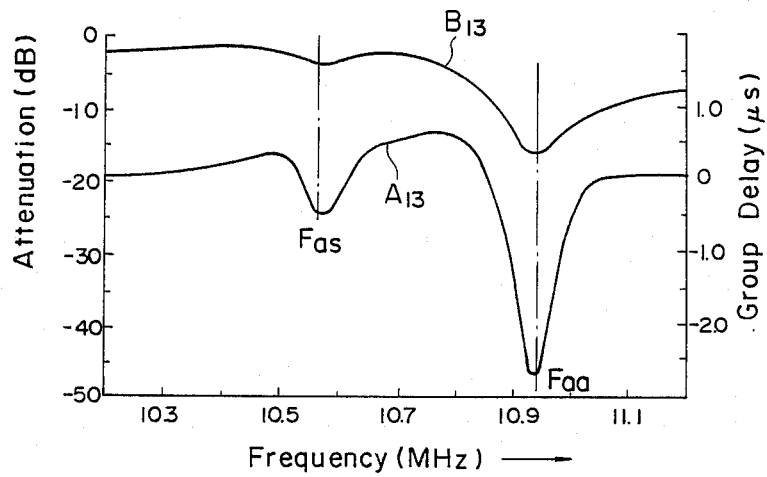
FIG. 24 shows characteristics curves of the phase equalizer of FIG. 21.

The anti-resonant frequencies $F_{as}$ and $F_{aa}$ are expressed as follows.

$$F_{as} = (1/2\pi)\sqrt{\frac{-b + \sqrt{b^2 - 4ac}}{2a}}$$

$$F_{aa} = (1/2\pi)\sqrt{\frac{-b - \sqrt{b^2 - 4ac}}{2a}}$$

where;
$a = -L_a L_s C_a C_s (C_{in} + C_1)$
$b = C_{in}(L_s C_s + L_a C_a) + C_s C_a (L_a + L_s)$
$c = -C_a - C_s - C_{in} - C_1$ FIG. 24 shows the attenuation response and the group delay time characteristics of the phase equalizer of FIG. 21. In FIG. 24, the horizontal axis shows the frequency in MHz, the vertical left axis shows the attenuation in dB, and the vertical right axis shows the group delay time in μS. The curve $A_{13}$ shows the group delay time characteristics, and the curve $B_{13}$ shows the attenuation response.

As apparent in the curve $A_{13}$ of FIG. 24, the group delay time characteristics $A_{13}$ has the convex characteristics between the anti-resonant frequencies $F_{aa}$ and $F_{as}$. Therefore, the phase equalizer of FIG. 21 can compensate the phase distortion of a ceramic filter which has concave group delay characteristics.

Figure 25:
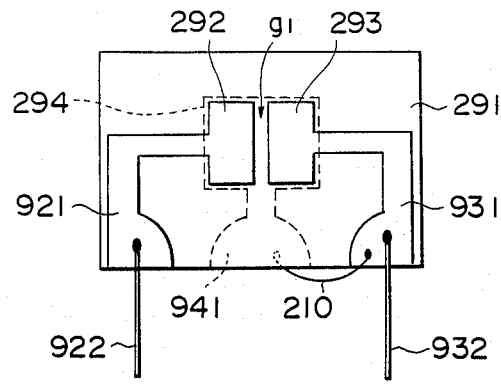
FIG. 25 is a plane view of a ceramic resonator of FIG. 21.
Figure 26:
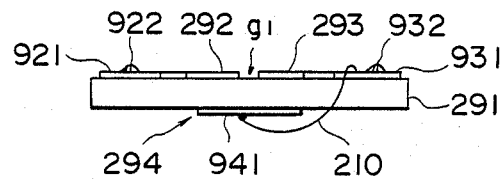
FIG. 26 is a side view of FIG. 25.
Figure 27:
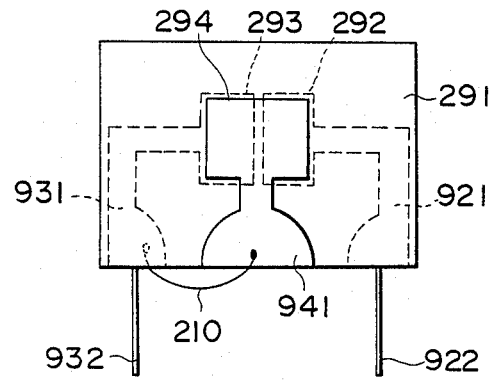
FIG. 27 is a bottom view of FIG. 25.

FIGS. 25, 26 and 27 show the structure of the phase equalizer of FIG. 21, in which FIG. 25 is a plane view, FIG. 26 is a side view, and FIG. 27 is a bottom view. In those figures, the numeral 291 is a rectangular piezoelectric substrate, on one surface of which a pair of separated electrodes 292 and 293 are deposited with the spacing $g_1$. A common electrode 294 is deposited on the other surface of the substrate so that the common electrode 294 faces with both the separated electrodes 292 and 293. The lead electrode 931 connected to the separated electrodes 293 is connected to the lead electrode 941 which is connected to the common electrode 294 through the lead wire 210. The lead electrode 921 which is connected to the separated electrode 292 is connected to the lead terminal 922 which is to be connected to the input terminal 205. The lead electrode 931 which is connected to the separated electrode 293 (and the common electrode 294) is connected to the lead terminal 932 which is to be connected to the output terminal 207.

Figure 28:
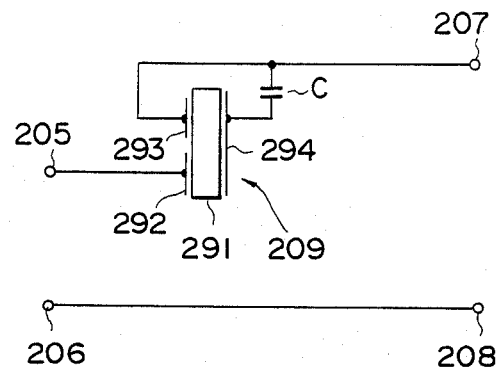
FIG. 28 is a modification of the phase equalizer of FIG. 21.

FIG. 28 is the modification of the phase equalizer of FIG. 21. The feature of FIG. 28 is the presence of the capacitor C which couples the common electrode 294 with one of the separated electrodes. That capacitor C may be replaced by a resistor. The embodiment of FIG. 28 provides also the convex group delay time characteristics between the anti-resonant frequencies $F_{as}$ and $F_{aa}$.

Figure 29:
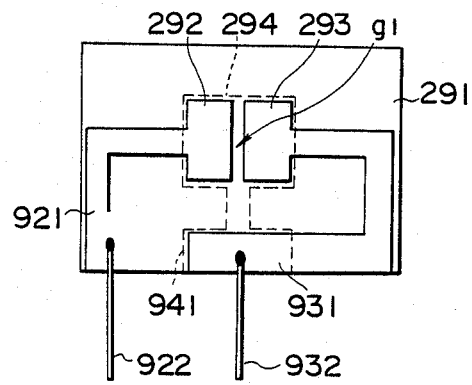
FIG. 29 is a plane view of a ceramic resonator of FIG. 28.
Figure 30:
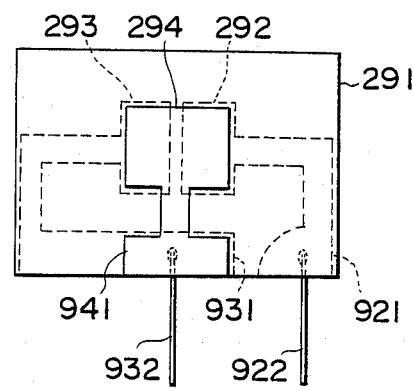
FIG. 30 is a bottom view of FIG. 29.

FIG. 29 is the plane view of the phase equalizer of FIG. 28, and FIG. 30 is the bottom view of FIG. 29. The separated electrode 293 is connected to the lead electrode 931, and the common electrode 294 is connected to the electrode 941, and those lead electrodes 931 and 941 have some overlap area which functions as capacitance. The lead electrode 921 coupled with the separated electrode 292 is connected to the lead terminal 922 which is to be connected to the input terminal 205. The lead electrode 931 coupled with the separated electrode 293 is connected to the lead terminal 932.

Figure 31:
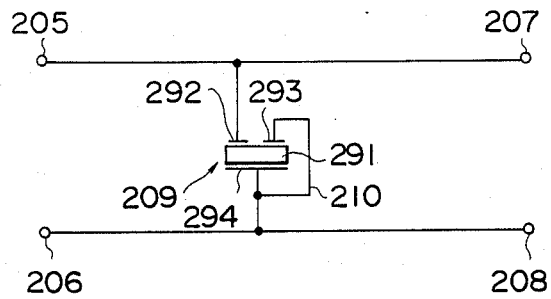
FIG. 31 is a modification of FIG. 21.
Figure 32:
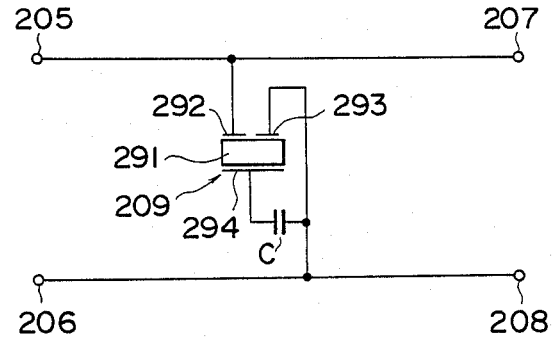
FIG. 32 is a modification of FIG. 28.

FIGS. 31 and 32 are modifications of FIGS. 21 and 28, respectively. In those modifications, the phase equalizer with a pair of separated electrodes is inserted in a parallel arm of a four-terminal network, instead of a series arm in the embodiments of FIG. 21 and FIG. 28. The modifications of FIGS. 31 and 32 have also the convex group delay time characteristics between the resonant frequencies $F_{rs}$ and $F_{ra}$.

It is possible of course that more than two ceramic resonators are used in a single phase equalizer. The embodiments having a plurality of resonators are described here.

Figure 33:
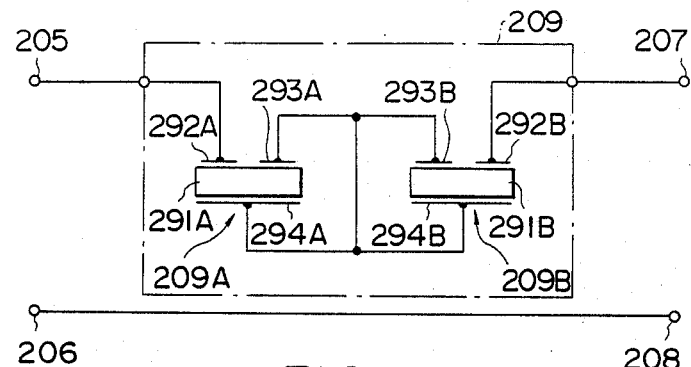
FIG. 33 is still another modification of the phase equalizer according to the present invention.

FIG. 33 is the embodiment having two ceramic resonators 209A and 209B, which are inserted in the series arm of a four-terminal network. The first ceramic resonator 209A has a piezoelectric ceramic substrate 291A having a pair of separated electrodes 292A and 293A on one surface of the substrate, and a common electrode 294A facing the separated electrodes on the other surface of the substrate. The second ceramic resonator 209B has also a piezoelectric ceramic substrate 291B which has a pair of separate electrodes 292B and 293B, and a common electrode 294B. The separated electrodes 293A and 293B are connected to the common electrode 294A (and 294B). The separated electrode 292A is connected to the input terminal 205, and the separated electrode 292B is connected to the output terminal 207.

Figure 34:
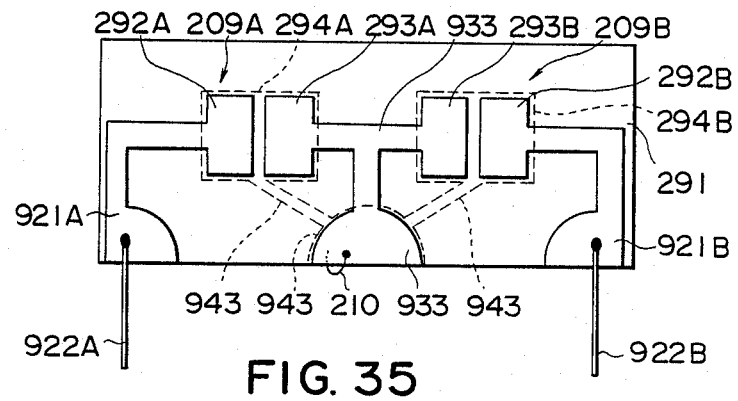
FIG. 34 is a plane view of a ceramic resonator of FIG. 33.
Figure 35:
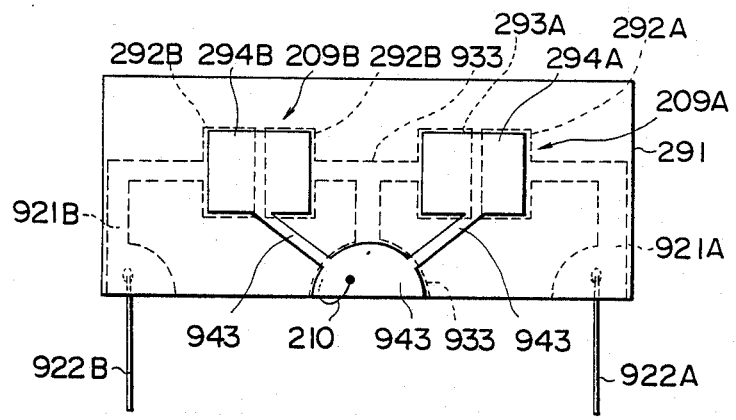
FIG. 35 is a bottom view of FIG. 34.

The twin resonators of FIG. 33 may be obtained by using two separate resonators of FIG. 25. Alternatively, those twin resonators may be mounted on a single substrate so that the total size of the device is reduced. FIGS. 34 and 35 show the structure of twin resonators. In those figures, a single piezoelectric ceramic substrate 291 mounts a first resonator having a pair of separated electrodes 292A and 293A and a common electrode 294A, and a second resonator having a pair of separated electrodes 292B and 293B and a common electrode 294B.

The separated electrode 293A of the first resonator is connected to the separated electrode 293B of the second resonator through the lead electrode 933. The common electrodes 294A and 294B are connected together through the lead electrode 943. And the lead electrodes 933 and 943 are coupled together through the lead wire 210. The lead electrode 921A which is connected to the separated electrode 292A is connected to the lead terminal 922A. The lead electrode 921B connected to the separated electrode 292B is connected to the lead terminal 922B.

Figure 36:
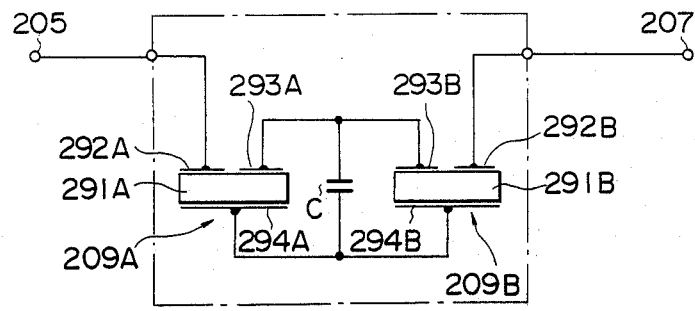
FIG. 36 is a modification of FIG. 33.

FIG. 36 is another embodiment which has two resonators, in which a capacitor C is inserted between a separated electrode and a common electrode.

Figure 37:
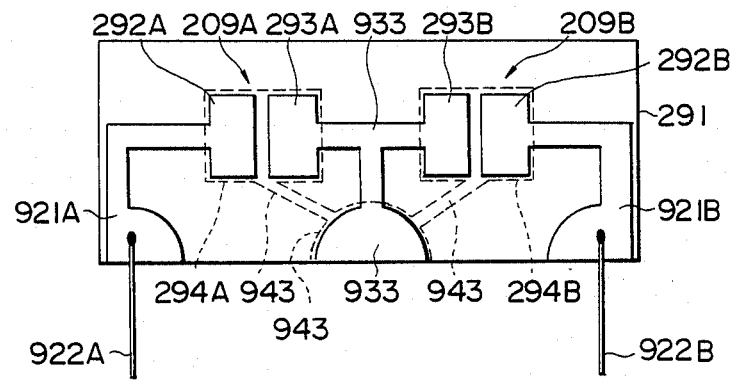
FIG. 37 is a plane view of a ceramic resonator of FIG. 36.
Figure 38:
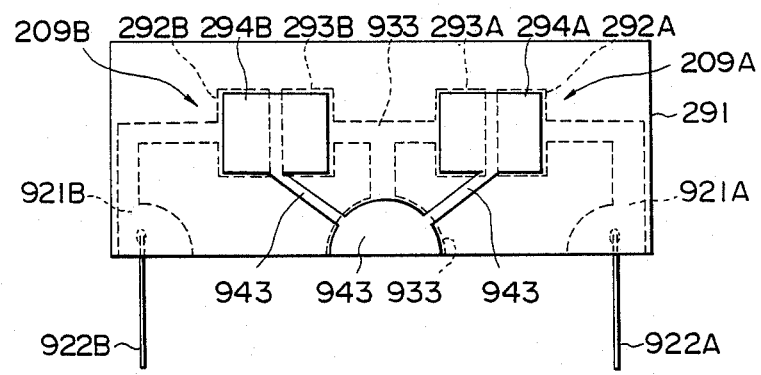
FIG. 38 is a bottom view of FIG. 37.

FIG. 37 is a plane view of the phase equalizer with two resonators of FIG. 36, and FIG. 38 is the bottom view of FIG. 37. The same numerals in those figures show the same members as those in FIGS. 34 and 35. The capacitor C is implemented by the overlap area of the lead electrode 933 which is connected to the electrodes 293A and 293B, and the lead electrode 943 which is connected to the common electrodes 294A and 294B.

Figure 39:
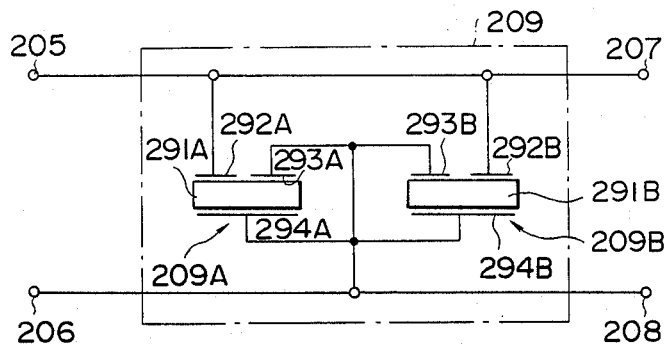
FIG. 39 is a still another modification of FIG. 33.

FIG. 39 is still another embodiment which has two resonators, in which the phase equalizer is inserted in a parallel arm of a four-terminal network. In FIG. 39, the phase equalizer 209 has a first resonator 204A which has a pair of separated electrodes 292A and 293A, and a common electrode 294A, and a second resonator 209B which has a pair of separated electrodes 292B and 293B, and a common electrode 294B. The separated electrodes 293A and 293B are connected together to the common electrodes 294A and 294B. The separated electrode 292A of the first resonator 209A is connected to the input terminal 205. The separated electrode 292B of the second resonator 209B is connected to the output terminal 207. And, the separated electrodes 293A and 293B and the common electrodes 294A and 294B are connected to the line between the terminals 206 and 208.

Figure 40:
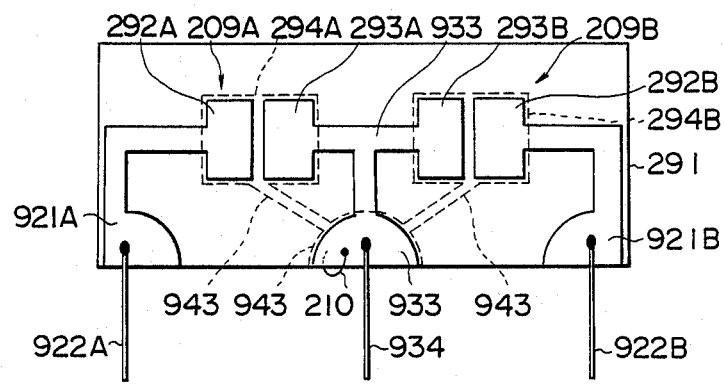
FIG. 40 is a plane view of a ceramic resonator of FIG. 39.
Figure 41:
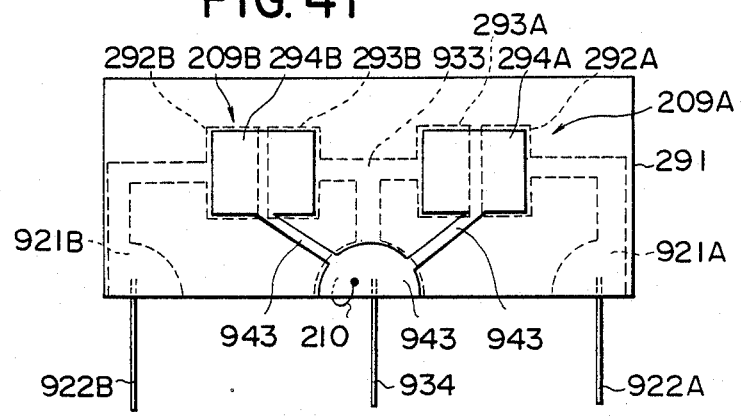
FIG. 41 is a bottom view of FIG. 40.

The structure of the twin resonators of FIG. 39 is shown in FIGS. 40 and 41. The structure of FIGS. 40 and 41 is similar to that of FIGS. 34 and 35, except that a lead terminal 934 which is connected to the lead electrode 943 connected to the common electrodes 294A and 294B exists. The lead terminal 934 is connected to the line between the terminals 206 and 208.

Figure 42:
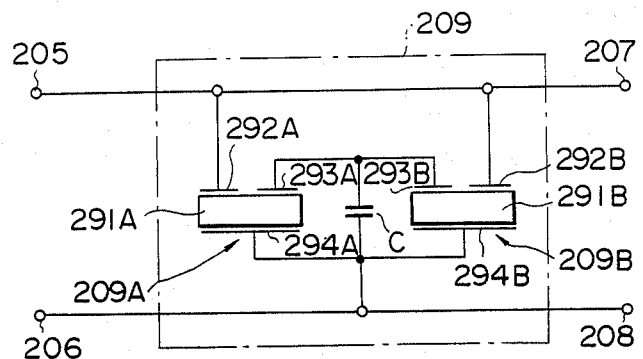
FIG. 42 is a still another modification of FIG. 33.

FIG. 42 shows still another embodiment which has two resonators. The feature of this embodiment is the presence of the capacitor C between the separated electrodes 293A and 293B, and the common electrodes 294A and 294B.

Figure 43:
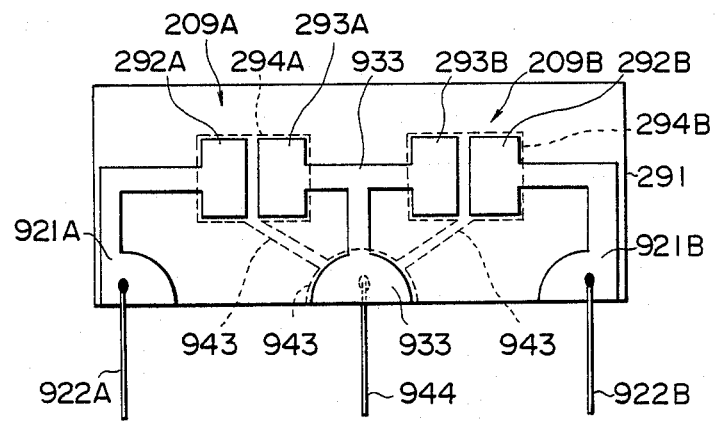
FIG. 43 is a plane view of a ceramic resonator of FIG. 42.
Figure 44:
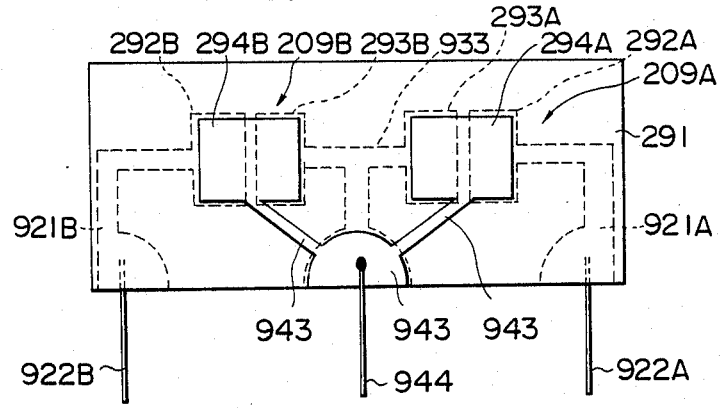
FIG. 44 is a bottom view of FIG. 43.

FIG. 43 is the plane view of the structure of the phase equalizer of FIG. 42, in which two resonators are mounted on a single piezoelectric substrate 291, and FIG. 44 is the bottom view of FIG. 43. The same numerals in FIGS. 43 and 44 show the same members as those in FIGS. 40 and 41. The capacitor C is imlemented by the overlap area of the lead electrode 933 which is connected to the separated electrodes 293A and 293B, and the lead electrodes 943 which is connected to the common electrodes 294A and 294B. The lead electrode 943 is connected to the lead electrode 944.

As described above, the present phase equalizer has the convex group delay time characteristics. So, the concave group delay time of a filter for selectivity is compensated for by the present phase equalizer, and the excellent speech quality and/or the excellent error rate are obtained, by providing the flat group delay time characteristics and removing distortion of a signal.

Further, it should be appreciated that the present phase equalizer is implemented by a cermic resonator which is small in size, and light in weight. No adjustment of an equalizer after the equalizer is mounted in a radio set or a television receiver set is necessary, therefore, a set mounting the present equalizer is small is size and stable in operation.

From the foregoing it will not be apparent that a new and improved phase equalizer has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A phase equalizer having a convex-shaped group delay characteristic, for insertion in a four-terminal network of a circuit having a predetermined bandwidth and a concave shaped group delay characteristic, comprising:
   a first ceramic resonator inserted in a series arm between an input terminal and an output terminal of said four-terminal network;
   a second ceramic resonator inserted in a parallel arm either at an input terminal or at an output terminal of said four-terminal network;
   said first ceramic resonator and said second ceramic resonator being mounted on a common single ceramic piezoelectric substrate;
   said first ceramic resonator having anti-resonant frequency at one end of said bandwidth; and
   said second ceramic resonator having resonant frequency at the other end of said bandwidth.

2. A phase equalizer according to claim 1, with the electrode size of the first ceramic resonator differing from that of the second ceramic resonator so that the resonant frequency differs from the second resonant frequency.

3. A phase equalizer as defined by claim 2, wherein said circuit having a predetermined bandwidth includes a ceramic filter, said filter being coupled with the phase equalizer through a buffer amplifier.

4. A phase equalizer according to claim 1, wherein one of the ceramic resonators has a mass on the electrode.

5. A phase equalizer as defined by claim 4, wherein said circuit having a predetermined bandwidth includes a ceramic filter, said filter being coupled with the phase equalizer through a buffer amplifier.

6. A phase equalizer according to claim 1, wherein said resonators have a common electrode on one surface of the substrate, and a pair of separate electrodes with a predetermined spacing on the other surface of said substrate, and one of the separate electrodes is electrically coupled with said common electrode.

7. A phase equalizer according to claim 6, wherein a capacitor is provided between one of the separate electrodes and the common electrode.

8. A phase equalizer according to claim 7, wherein said capacitor is also mounted on the same substrate as the phase equalizer itself.

9. A phase equalizer as defined by claim 7, wherein said circuit having a predetermined bandwidth includes a ceramic filter, said filter being coupled with the phase equalizer through a buffer amplifier.

10. A phase equalizer according to claim 6, wherein more than two phase equalizers of claim 6 coupled electrically with each other are mounted on a single common ceramic substrate.

11. A phase equalizer as defined by claim 6, wherein said circuit having a predetermined bandwidth includes a ceramic filter, said filter being coupled with the phase equalizer through a buffer amplifier.

12. A phase equalizer as defined by claim 1, wherein said circuit having a predetermined bandwidth includes a ceramic filter, said filter being coupled with the phase equalizer through a buffer amplifier.

13. A phase equalizer having a convex-shaped group delay characteristic, for insertion in a four-terminal network of a circuit having a predetermined bandwidth and a concave shaped group delay characteristic, comprising:
   a first ceramic resonator inserted in a series arm between an input terminal and an output terminal of said four-terminal network;
   a second ceramic resonator also inserted in said series arm, and in parallel with said first ceramic resonator;
   said first ceramic resonator and said second ceramic resonator being mounted on a common single ceramic piezoelectric substrate;

said first ceramic resonator having anti-resonant frequency at one end of said bandwidth, and said second ceramic resonator having resonant frequency at the other end of said bandwidth.

14. A phase equalizer as defined by claim 13, wherein said circuit having a predetermined bandwidth includes a ceramic filter, said filter being coupled with the phase equalizer through a buffer amplifier.

15. A phase equalizer having a convex-shaped group delay characteristic, for insertion in a four-terminal network of a circuit having a predetermined bandwidth and a concave shaped group delay characteristic, comprising:

a first ceramic resonator and a second ceramic resonator in parallel with said first ceramic resonator, said parallel combination being inserted in a parallel arm of said four-terminal network;

said first ceramic resonator and said second ceramic resonator being mounted on a common single ceramic piezoelectric substrate;

said first ceramic resonator having anti-resonant frequency at one end of said bandwidth; and said second ceramic resonator having resonant frequency at the other end of said bandwidth.

16. A phase equalizer as defined by claim 15, wherein said circuit having a predetermined bandwidth includes a ceramic filter, said filter being coupled with the phase equalizer through a buffer amplifier.

* * * * *